US010321563B2

(12) United States Patent
Robinson et al.

(10) Patent No.: US 10,321,563 B2
(45) Date of Patent: Jun. 11, 2019

(54) APPARATUS AND ASSOCIATED METHODS FOR DEFORMABLE ELECTRONICS

(71) Applicant: Nokia Technologies Oy, Espoo (FI)

(72) Inventors: Adam Robinson, Cambridge (GB); Darryl Cotton, Hemingford Grey (GB); Piers Andrew, Cambridge (GB)

(73) Assignee: Nokia Technologies Oy, Espoo (FI)

(*) Notice: Subject to any disclaimer, the term of this patent is extended or adjusted under 35 U.S.C. 154(b) by 0 days.

(21) Appl. No.: 15/505,220

(22) PCT Filed: Aug. 28, 2015

(86) PCT No.: PCT/FI2015/050554
§ 371 (c)(1),
(2) Date: Feb. 20, 2017

(87) PCT Pub. No.: WO2016/030578
PCT Pub. Date: Mar. 3, 2016

(65) Prior Publication Data
US 2017/0257944 A1 Sep. 7, 2017

(30) Foreign Application Priority Data
Aug. 29, 2014 (EP) .................................. 14182953

(51) Int. Cl.
*H05K 1/02* (2006.01)
*H05K 3/10* (2006.01)
(Continued)

(52) U.S. Cl.
CPC ....... *H05K 1/0283* (2013.01); *H01L 23/4985* (2013.01); *H05K 1/189* (2013.01);
(Continued)

(58) Field of Classification Search
CPC .................................................. H05K 1/0283
(Continued)

(56) References Cited

U.S. PATENT DOCUMENTS 4,858,073 A 8/1989 Gregory
6,275,361 B1 8/2001 Wallash et al.
(Continued)

FOREIGN PATENT DOCUMENTS

CN 1864094 A 11/2006
CN 101785373 A 7/2010
(Continued)

OTHER PUBLICATIONS

Sun et al., "Buckled and Wavy Ribbons of GaAs for High-Performance Electronics on Elastomeric Substrates", Advanced Materials, vol. 18, No. 21, 2006, pp. 2857-2862.
(Continued)

*Primary Examiner* — Stanley Tso
(74) *Attorney, Agent, or Firm* — Alston & Bird LLP (57) ABSTRACT

An apparatus comprising a deformable substrate, an electrical interconnect suitable for interconnecting one or more electronic components located on the deformable substrate to one another or to one or more electronic components located on another substrate, and a support beam configured to couple the electrical interconnect to the deformable substrate, wherein the electrical interconnect comprises one or more curved sections and adjoining straight sections, and wherein the electrical interconnect is attached to the support beam via the adjoining straight sections such that the one or more curved sections are suspended over the deformable substrate to enable the electrical interconnect to accommodate strain when the deformable substrate undergoes operational deformation.

20 Claims, 8 Drawing Sheets

(51) Int. Cl.
*H01L 23/498* (2006.01)
*H05K 1/18* (2006.01)

(52) U.S. Cl.
CPC ..... *H05K 3/103* (2013.01); *H05K 2201/0314* (2013.01); *H05K 2201/0394* (2013.01); *H05K 2201/09263* (2013.01)

(58) Field of Classification Search
USPC ......................................................... 174/254
See application file for complete search history.

(56) References Cited

U.S. PATENT DOCUMENTS

| | | | |
|---|---|---|---|
| 6,403,892 | B1 | 6/2002 | Feger et al. |
| 6,483,037 | B1 | 11/2002 | Moore et al. |
| 8,895,864 | B2* | 11/2014 | Cotton ................ H05K 1/0283 174/254 |
| 2001/0030060 | A1 | 10/2001 | Carroll |
| 2002/0094701 | A1 | 7/2002 | Biegelsen et al. |
| 2002/0197002 | A1 | 12/2002 | Lin |
| 2004/0016568 | A1 | 1/2004 | Palanisamy |
| 2004/0238819 | A1 | 12/2004 | Maghribi et al. |
| 2006/0286785 | A1 | 12/2006 | Rogers et al. |
| 2007/0029671 | A1 | 2/2007 | Yamasaki |
| 2007/0115572 | A1 | 5/2007 | Van Dam et al. |
| 2008/0149372 | A1 | 6/2008 | Choi et al. |
| 2008/0257586 | A1 | 10/2008 | Chen et al. |
| 2009/0173529 | A1* | 7/2009 | Lee ...................... H05K 1/0283 174/261 |
| 2009/0244859 | A1* | 10/2009 | Muro ................... H05K 1/0218 361/749 |
| 2009/0283891 | A1* | 11/2009 | Dekker ............... H01L 23/5387 257/690 |
| 2010/0140785 | A1 | 6/2010 | Killer et al. |
| 2010/0143848 | A1 | 6/2010 | Jain et al. |
| 2010/0330338 | A1 | 12/2010 | Boyce et al. |
| 2011/0026233 | A1 | 2/2011 | Hong et al. |
| 2011/0272181 | A1* | 11/2011 | Koo ..................... H05K 1/0219 174/254 |
| 2011/0309526 | A1 | 12/2011 | Cho et al. |
| 2012/0051005 | A1 | 3/2012 | Vanfleteren et al. |
| 2012/0052268 | A1 | 3/2012 | Axisa et al. |
| 2012/0069584 | A1 | 3/2012 | Kawabe et al. |
| 2012/0181068 | A1* | 7/2012 | Kato .................... H05K 1/0281 174/254 |
| 2012/0314382 | A1* | 12/2012 | Wesselmann ........ H05K 1/0283 361/749 |
| 2013/0312256 | A1 | 11/2013 | Wesselmann et al. |
| 2014/0012160 | A1 | 1/2014 | Ghaffari et al. |
| 2014/0097010 | A1 | 4/2014 | Plant |
| 2014/0097944 | A1 | 4/2014 | Fastert et al. |
| 2014/0102771 | A1 | 4/2014 | Kajiya et al. |
| 2014/0104793 | A1 | 4/2014 | Park et al. |
| 2014/0140020 | A1 | 5/2014 | Rogers et al. |
| 2015/0380355 | A1* | 12/2015 | Rogers ................. H01L 23/538 257/773 |

FOREIGN PATENT DOCUMENTS

| | | |
|---|---|---|
| CN | 102687598 A | 9/2012 |
| CN | 103563494 A | 2/2014 |
| DE | 102007046639 A1 | 4/2009 |
| EP | 044247 A1 | 1/1982 |
| EP | 1168897 A2 | 1/2002 |
| EP | 1783555 A2 | 5/2007 |
| EP | 1830619 A2 | 9/2007 |
| GB | 1358353 A | 7/1974 |
| GB | 2489508 A | 10/2012 |
| GB | 2524327 A | 9/2015 |
| JP | H01-100467 A | 4/1989 |
| JP | H07-283494 A | 10/1995 |
| JP | 2003-101165 A | 4/2003 |
| JP | 2005-235997 A | 9/2005 |
| JP | 2006-005026 A | 1/2006 |
| JP | 2006-182918 A | 7/2006 |
| JP | 2006-310554 A | 11/2006 |
| JP | 2007-250998 A | 9/2007 |
| JP | 2011-040607 A | 2/2011 |
| JP | 2011-233822 A | 11/2011 |
| KR | 2008-0043068 A | 5/2008 |
| RU | 2176857 C2 | 12/2001 |
| SU | 1001527 A1 | 2/1983 |
| WO | 2009/028110 A1 | 3/2009 |
| WO | 2010/086416 A1 | 8/2010 |
| WO | 2012/112310 A1 | 8/2012 |
| WO | 2013/019510 A1 | 2/2013 |
| WO | 2013/149181 A | 10/2013 |
| WO | 2014/022558 A1 | 2/2014 |

OTHER PUBLICATIONS

Kim et al., "Stretchable Electronics: Materials Strategies and Devices", Advanced Materials, vol. 20, 2008, pp. 4887-4892.

Huyghe et al., "Design and Manufacturing of Stretchable High-Frequency Interconnects", IEEE Transactions on Advanced Packaging, vol. 31, No. 4, Nov. 2008, pp. 802-808.

Axisa et al., "Elastic and Conformable Electronic Circuits and Assemblies Using MID in Polymer", 6th International Conference on Polymers and Adhesives in Microelectronics and Photonics, Jan. 16-18, 2007, pp. 280-286.

Cotton et al., "Photopalleming the Mechanical Properties of Polydimethylsiloxane Films", Journal of Applied Physics, vol. 109, 2011, pp. 1-6.

Verplancke et al., "Thin-Film Stretchable Electronics Technology Based on Meandering Interconnections: Fabrication and Mechanical Performance", Journal of Micromechanics and Microengineering, vol. 22, No. 1, Dec. 8, 2011, pp. 1-9.

Vanflfleteren et al., "Printed Circuit Board Technology Inspired Stretchable Circuits", MRS Bulletin, vol. 37, No. 3, 2012, pp. 254-260.

Wagner et al., "Materials for Stretchable Electronics", MRS Bulletin, vol. 37, No. 3, 2012, pp. 207-213.

"STretchable ELectronics for Large Area applications", Stella Newsletter III, Retrieved on Feb. 21, 2017, Webpage available at : http://www.hta-online.eu/fileadmin/MEDIA/Press_and_Media/Poster_Stella_neu.pdf.

Bossuyt et al., "A New Low Cost, Elastic and Conformable Electronics Technology for Soft and Stretchable Electronic Devices by Use of a Stretchable Substrate", European Microelectronics and Packaging Conference, Jun. 15-18, 2009, 6 pages.

Kim et al., "Materials and Noncoplanar Mesh Designs for Integrated Circuits With Linear Elastic Responses to Extreme Mechanical Deformations", Proceedings of the National Academy of Sciences of the United States of America, vol. 105, No. 48, pp. 18675-18680.

International Search Report and Written Opinion received for corresponding Patent Cooperation Treaty Application No. PCT/IB2013/051710, dated Sep. 17, 2013, 15 pages.

Sekitani et al. "Stretchable Active-Matrix Organic Light-emitting Diode Display Using Printable Elastic Conductors", Nature Materials, 2009, vol. 8, pp. 494-499.

Lu et al., "Delamination of Stiff Islands Patterned on Stretchable Substrates", International Journal of Materials Research, vol. 98, No. 8, 2007, pp. 717-722.

Sluis et al., "Stretching Induced Interconnect Delamination in Stretchable Electronic Circuits", Journal of Physics D: Applied Physics, vol. 44, No. 3, 2011, pp. 1-19.

Non-Final Office action received for corresponding U.S. Appl. No. 13/435,372, dated Mar. 12, 2014, 10 pages.

Search Report received for corresponding United Kingdom Patent Application No. 1405081.9, dated Aug. 14, 2014, 3 pages.

Office action received for corresponding Vietnam Patent Application No. 1-2014-03295, dated Feb. 13, 2015, 1 pages of office action and 1 pages of office action translation available.

International Search Report and Written Opinion received for corresponding Patent Cooperation Treaty Application No. PCT/FI2015/050131, dated Jun. 9, 2015, 12 pages.

(56) References Cited

OTHER PUBLICATIONS

Office action received for corresponding Korean Patent Application No. 2014-7030166, dated Jun. 18, 2015, 6 pages of office action and no pages of office action translation available.
Office action received for corresponding Korean Patent Application No. 2014-7030166, dated Dec. 23, 2015, 3 pages of office action and no pages of office action translation available.
Office action received for corresponding Russian Patent Application No. 2014139217, dated Mar. 10, 2016, 6 pages of office action and 3 pages of office action translation available.
Medvedev, "Materials for flexible printed circuit boards", Technologies in the electronics industry, No. 3, 2011, pp. 12-19.
Office action received for corresponding Japanese Patent Application No. 2015-502482, dated Mar. 15, 2016, 5 pages of office action and 5 pages of office action translation available.
Office action received for corresponding Chinese Patent Application No. 201380027490.8, dated Sep. 27, 2016, 9 pages of office action and 3 pages of office action translation available.
Office action received for corresponding Japanese Patent Application No. 2015-502482, dated Nov. 22, 2016, 4 pages of office action and 4 pages of office action translation available.
Bossuyt et al., "Cyclic Endurance Reliability of Stretchable Electronic Substrates", Microelectronics Reliability, vol. 51, No. 3, Mar. 2011, pp. 628-635.
Ahn et al., "Stretchable Electronics: Materials, Architectures and Integrations", Journal of Physics D: Applied Physics, vol. 45, No. 10, Feb. 22, 2012, pp. 1-14.
Gutruf et al., "Strain Response of Stretchable Micro-electrodes: Controlling Sensitivity With Serpentine Designs and Encapsulation", Applied Physics Letters, vol. 104, No. 2, Jan. 2014, pp. 1-4.
Extended European Search Report received for corresponding European Patent Application No. 14182953.1, dated Apr. 2, 2015, 8 pages.
International Search Report and Written Opinion received for corresponding Patent Cooperation Treaty Application No. PCT/FI2015/050554, dated Mar. 22, 2016, 16 pages.
Office Action received for corresponding European Patent Application No. 14182953.1, dated Sep. 23, 2016, 4 pages.
Notice of Allowance for U.S. Appl. No. 13/435,372, dated Aug. 1, 2014, 7 pages.
Partial European Search Report from corresponding European Patent Application No. 14182953.1, dated Dec. 15, 2014, 6 pages.
Decision to Grant European Application No. 14182953.1 dated Oct. 25, 2018, 1 page.
Office Action for Chinese Application No. 201580056493.3 dated Nov. 29, 2018, 8 pages.

* cited by examiner

Figure 8a
Adhered to surface

Figure 8b
Embedded at surface

Figure 8c
10 μm embedded pin

1414 — Form electrical interconnect comprising one or more curved sections and adjoining straight sections 1415 — Attach electrical interconnect to support beam via straight sections such that one or more curved sections are suspended over deformable substrate

Figure 15

APPARATUS AND ASSOCIATED METHODS FOR DEFORMABLE ELECTRONICS

RELATED APPLICATION

This application was originally filed as PCT Application No. PCT/FI2015/050554 filed Aug. 28, 2015 which claims priority benefit from EP Patent Application No. 14182953.1 filed Aug. 29, 2014.

TECHNICAL FIELD

The present disclosure relates to the field of deformable electronics, associated methods and apparatus, and in particular concerns an apparatus comprising an electrical interconnect coupled to a deformable substrate via a support beam such that the electrical interconnect can accommodate strain when the deformable substrate undergoes operational deformation. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop flexible and/or stretchable circuit boards for use in modern electronic devices.

One or more aspects/embodiments of the present disclosure may or may not address these issues.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising a deformable substrate, an electrical interconnect suitable for interconnecting one or more electronic components located on the deformable substrate to one another or to one or more electronic components located on another substrate, and a support beam configured to couple the electrical interconnect to the deformable substrate, wherein the electrical interconnect comprises one or more curved sections and adjoining straight sections, and wherein the electrical interconnect is attached to the support beam via the adjoining straight sections such that the one or more curved sections are suspended over the deformable substrate to enable the electrical interconnect to accommodate strain when the deformable substrate undergoes operational deformation.

The electrical interconnect may be configured to accommodate one or more of tensile, normal, compressive and shearing strain when the deformable substrate undergoes corresponding operational deformation. The electrical interconnect may be configured to accommodate strains of up to 5%, 10%, 15%, 20%, 25%, 30%, 40%, 50%, 75%, 100%, 150% or 200%. The strain that the electrical interconnect can accommodate depends on the lifetime (number of strain cycles) required of the apparatus/device. The maximum stress in the electrical interconnect at a given applied strain determines the number of cycles to that strain until mechanical failure (following a standard S-N curve for the interconnect material). The maximum stress can be reduced by increasing the arc angle, decreasing the track width-to-radius ratio and/or decreasing the Young's modulus (material used), which provides a large range of applied strains and apparatus/device lifetimes. The maximum possible strain would typically involve the use of an elastomeric conductor as the electrical interconnect, which may be able to accommodate strains of at least 1200%.

The electrical interconnect may or may not be self-supporting (i.e. sufficiently rigid to support its own weight). Whether the electrical interconnect can support its own weight or not depends on the modulus of the material, the geometry of the electrical interconnect (e.g. second moment of area), the density of the material, and the distance of the centre of mass of the suspended curved sections from the support beam. For lower modulus materials (e.g. an electrically conductive elastomer), the thickness of the electrical interconnect may be increased, the width of the electrical interconnect may be decreased and/or the distance that the curved sections extend from the support beam may be decreased, in order to increase the rigidity of the electrical interconnect. In this respect, the one or more curved sections may be spaced apart from the deformable substrate, or they may be in physical contact with (i.e. supported by) the deformable substrate. The term "suspended" may therefore be taken to mean that the curved sections are not attached to the deformable substrate.

The electrical interconnect may be configured such that the straight sections cross the support beam at an angle of between −10° and +40° with respect to the normal of the support beam. The electrical interconnect may be configured such that the curved sections have an arc angle of between 180° and 320° and a radius of between 1 μm and 1 cm.

The electrical interconnect may be configured such that the straight sections cross the support beam at an angle of between +10° and +25° with respect to the normal of the support beam. The curved sections may have an arc angle of 270° and a radius of between 150 μm and 300 μm.

The electrical interconnect may be configured such that the straight sections cross the support beam at an angle of between +25° and +30° with respect to the normal of the support beam. The curved sections may have an arc angle of between 180° and 270° and a radius of 200 μm.

The electrical interconnect may be attached to the support beam by adhesion of the straight sections to a surface of the support beam.

The electrical interconnect may be attached to the support beam by embedding of the straight sections within a volume of the support beam.

The straight sections of the electrical interconnect may comprise respective protrusions extending therefrom, and the electrical interconnect may be attached to the support beam by embedding of the respective protrusions within a volume of the support beam.

The electrical interconnect and support beam may be configured to lie substantially parallel to, and spaced apart from, the planar surface of the deformable substrate. The longitudinal axis (i.e. length direction) of the electrical interconnect can be considered to extend substantially parallel to the plane of the deformable substrate.

The electrical interconnect may have a generally serpentine configuration. The electrical interconnect may be attached to the support beam such that adjacent curved sections of the serpentine configuration are positioned on opposite sides of the support beam.

The support beam may be attached to, or form part of, the deformable substrate.

The electrical interconnect may be configured such that the straight sections have a length which is at least equal to the width of the support beam.

One or both of the deformable substrate and support beam may be reversibly deformable. One or both of the deformable substrate and support beam may be at least one of reversibly flexible, reversibly stretchable and reversibly compressible.

One or both of the deformable substrate and support beam may comprise at least one of a polymeric material, an elastomeric material, polyurethane, polyimide, polyethylene terephthalate, polydimethylsiloxane and polyethylene napthalate.

The electrical interconnect may comprise one or more of an electrically conductive material, an electrically conductive polymer, an electrically conductive elastomer, a metal, an alloy, copper, gold, silver, graphene, indium tin oxide and one or more carbon nanotubes.

The deformable substrate may comprise one or more electronic components located thereon, and the electrical interconnect may be configured to provide an electrical interconnection between the one or more electronic components.

The deformable substrate and other substrate may each comprise one or more electronic components located thereon, and the electrical interconnect may be configured to provide an electrical interconnection between the one or more electronic components of the deformable substrate and the one or more electronic components of the other substrate.

The apparatus may comprise one or more of an electronic device, a portable electronic device, a portable telecommunications device, a mobile phone, a laptop computer, a tablet computer, a phablet computer, an electronic display, a sensor array, an adhesive bandage, a circuit board and a module for the same.

According to a further aspect, there is provided a method comprising:

forming an apparatus, the apparatus comprising a deformable substrate, an electrical interconnect suitable for interconnecting one or more electronic components located on the deformable substrate to one another or to one or more electronic components located on another substrate, and a support beam configured to couple the electrical interconnect to the deformable substrate, wherein the electrical interconnect comprises one or more curved sections and adjoining straight sections, and wherein the electrical interconnect is attached to the support beam via the adjoining straight sections such that the one or more curved sections are suspended over the deformable substrate to enable the electrical interconnect to accommodate strain when the deformable substrate undergoes operational deformation.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 2 illustrates schematically the strain profile of the support beam when a tensile stress is applied to the deformable substrate of FIG. 1a;

DESCRIPTION OF SPECIFIC ASPECTS/EMBODIMENTS

The Nokia "Morph™" concept phone is a deformable, flexible and stretchable device that requires reliable stretchable electronics to enable its realisation. Stretchable electronics may be considered as a composition of electronic materials and/or components formed across a substrate in a manner which allows the overall substrate to repeatedly deform (typically >>5%) without electrical failure. The materials should not exceed their elastic limit for repeated deformation. Other devices which may utilise stretchable electronics include stretchable adhesive bandages incorporating next-to-the-skin sensors, stretchable displays in which the display elements are supported on floating rigid islands, and flexible devices configured to undergo large out-of-plane strain such as foldable or rollable e-readers and tablets.

Two classes of stretchable circuit boards (SCBs) are currently available: rigid conductor SCBs and conformable conductor SCBs. Rigid conductor SCBs are constructed from materials where the thickness and stiffness of the electrical conductors or traces (and mounting layer in some instances) dominate the mechanical displacement of the substrate under strain. This type of conductor has the advantage that the change in resistance is very low when strained (typically <<1%). However, such conductors cannot be patterned in straight lines, but have to bend in the plane of the substrate surface, or out of the plane of the substrate surface, to accommodate strain. This feature enables the conductors to straighten out when stress is applied to the substrate thereby maintaining the original resistance. The disadvantages of this type of system are the increased strain induced on the rest of the substrate, and the design of the conductors which has to be carefully considered for stretch direction.

Conformable conductor SCBs, on the other hand, comprise generally thin conductors, cluster or ion beam implanted metals, or meshes of conducting nanowires which are adhered to the surface of the substrate. Unlike rigid conductor SCBs, these materials are dominated by the imparted forces of the underlying substrate and will deform according to the characteristics of the substrate. This is generally enabled through stress relieving cracks in the conductors. Less design consideration is required when forming these types of conductors, and they can be patterned in straight lines. Nevertheless, the resistance of the conductors changes with applied strain, which is typically undesirable.

There will now be described an apparatus and associated methods that may or may not provide a solution to one or more of these issues.

Figure 1A:
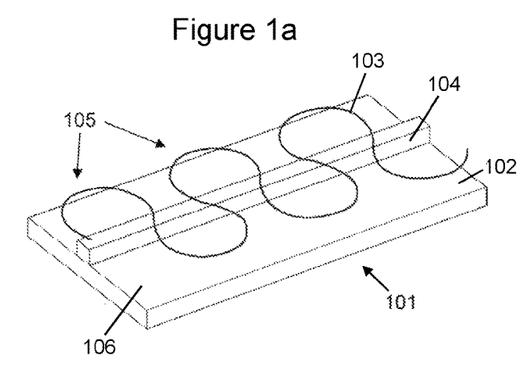
FIG. 1a illustrates schematically an apparatus comprising an electrical interconnect coupled to a deformable substrate via a support beam.

FIG. 1a shows one example of an apparatus 101 comprising a deformable substrate 102, an electrical interconnect 103 and a support beam 104. The electrical interconnect 103 is suitable for interconnecting one or more electronic components located on the deformable substrate 102 to one another or to one or more electronic components located on another substrate, and the support beam 104 is configured to couple the electrical interconnect 103 to the deformable substrate 102 such that a portion 105 of the electrical interconnect 103 is suspended (i.e. free to move rather than attached to restrict movement under operational conditions) over the deformable substrate 102. The support beam 104 may be a separate component of the apparatus 101 which is attached to the deformable substrate 102, or it may be an integral part of the deformable substrate 102. In addition, one or both of the deformable substrate 102 and the support beam 104 may be reversibly deformable (e.g. one or more of reversibly flexible, reversibly stretchable and reversibly compressible).

Since the electrical interconnect 103 is coupled to the deformable substrate 102 by the support beam 104, the amount of stress applied to the electrical interconnect 103 by deformation of the deformable substrate 102 is less than if the electrical interconnect 103 was coupled to the deformable substrate 102 directly. Furthermore, the electrical interconnect 103 comprises one or more curved sections 105. In this way, any operational stress which is applied to the electrical interconnect 103 when the substrate 102 is deformed can be accommodated by the curved sections 105, similar to the deformation of a spring. This configuration therefore serves to reduce the magnitude of strain within the electrical interconnect 103 which in turn reduces the likelihood of delamination of the electrical interconnect 103 from the deformable substrate 102 or support beam 104. It may also enable a rigid conductor to be used as the electrical interconnect 103 in a stretchable circuit board without inducing considerable strain on the other layers of the circuit board.

In the example shown in FIG. 1a, the electrical interconnect 103 has a generally serpentine configuration (i.e. S-shaped or reverse S-shaped) and is attached to the support beam 104 such that the adjacent curved sections 105 of the serpentine configuration are positioned on opposite sides of the support beam. In order to minimise the strain concentrations, the electrical interconnect 103 should ideally be centralised on the support beam 104 such that the curved sections 105 are evenly distributed on either side of the beam 104 (although this is not absolutely necessary). This arrangement allows the operational strain induced in the electrical interconnect 103 to be distributed more evenly, which facilitates expansion and contraction of the electrical interconnect 103. In this example, the electrical interconnect 103 and support beam 104 are also configured to lie substantially parallel to, and spaced apart from, the planar surface 106 of the deformable substrate 102. This configuration may be adopted, for example, by an electrical interconnect which is sufficiently rigid to support its own weight. In addition, the longitudinal axis (i.e. length direction) of the electrical interconnect 103 extends substantially parallel to the plane 106 of the deformable substrate 102.

Figure 1B:
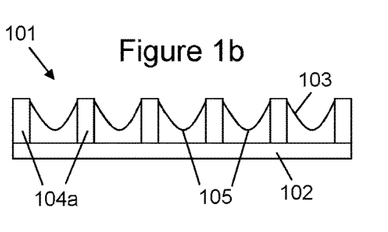
FIG. 1b illustrates schematically another apparatus comprising an electrical interconnect coupled to a deformable substrate via a support beam.

FIG. 1b shows another example (in cross-section) of an apparatus 101 comprising a deformable substrate 102, an electrical interconnect 103 and a support beam 104. In this example, the support beam 104 comprises a plurality of sub-beams 104a which are spaced apart from one another on the deformable substrate 102 to support different portions of the electrical interconnect 103 along its length. Furthermore, unlike the electrical interconnect 103 of FIG. 1a, the height of the electrical interconnect 103 of FIG. 1b (and therefore the distance between the electrical interconnect 103 and the underlying deformable substrate 102) varies along its length. This configuration may be adopted, for example, by an electrical interconnect 103 which is insufficiently rigid to support its own weight and therefore hangs between adjacent sub-beams 104a. In other embodiments, the electrical interconnect 103 could curve away from the deformable substrate 102 rather than curving towards the substrate 102 as shown in FIG. 1b. A mix of curving away/towards the substrate 102 may also be used in other embodiments.

In both of the examples shown in FIGS. 1a and 1b, the curved sections 105 of the electrical interconnect 103 are spaced apart from the deformable substrate 102. This is due to the presence of the support beam 104 and/or the self-supporting nature of the electrical interconnect 103. In other examples, however, the curved sections 105 of the electrical interconnect 103 may be in contact with the deformable substrate 102. Nevertheless, even in this scenario, the curved sections are not attached to the deformable substrate 102 to allow the electrical interconnect to accommodate strain.

Figure 2:
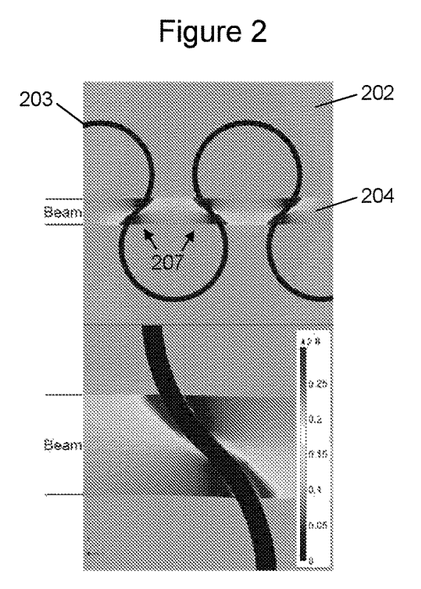

FIG. 2 shows a simulated strain profile (in plan view) of the support beam surface 204 when a tensile stress is applied to the deformable substrate 202 of FIG. 1a. Each of the simulations described herein were carried out using copper interconnects (COMSOL materials library copper values: Young's modulus 125 GPa, Poisson's ratio 0.335 at room temperature) with PDMS as the deformable substrate and support beam (Young's modulus 1 MPa. Poisson's ratio 0.5). It should be noted, however, that these materials/parameters were used merely as examples to illustrate the general trends observed and are not limiting. For example, the electrical interconnects may be fabricated from polymer with a thin metallic coating or conducting elastomer, and the deformable substrate and support beam may be formed from any elastomer.

The scale bar indicates the ratio of induced strain to applied strain. This simulation shows that applying a strain of only 10% along the beam direction in the deformable substrate 202 can produce local strain peaks at the interconnect-beam interface of 280%. Strain peaks of this magnitude can lead to delamination of the electrical interconnect 203 from the support beam 204 during repeated deformation. It has been found from further experiments that the shape and angle of the electrical interconnect 203 at the points 207 where it is attached to the support beam 204 can strongly affect the magnitude of strain at the interconnect-beam interface.

Figure 3:
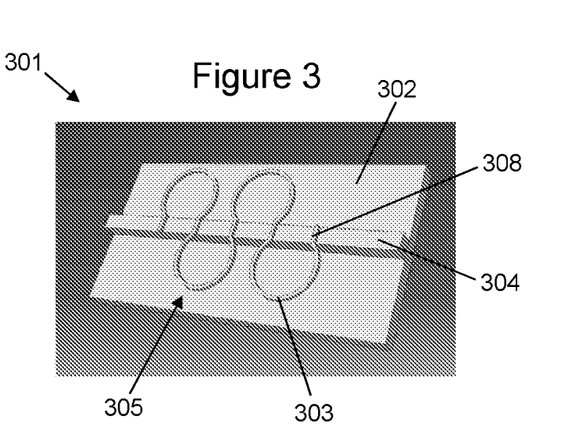
FIG. 3 illustrates schematically another apparatus comprising an electrical interconnect coupled to a deformable substrate via a support beam.

FIG. 3 shows another example of an apparatus 301 comprising an electrical interconnect 303 coupled to a deformable substrate 302 via a support beam 304. This time the electrical interconnect 303 comprises one or more curved sections 305 and adjoining straight sections 308, and is attached to the support beam 304 via the adjoining straight sections 308 such that the one or more curved sections 305 are suspended over the deformable substrate 302. Like the examples shown in FIGS. 1a and 1b, the use of suspended curved sections 305 enables the electrical interconnect 303 to accommodate operational strain when the deformable substrate 302 undergoes operational deformation.

Figure 4:
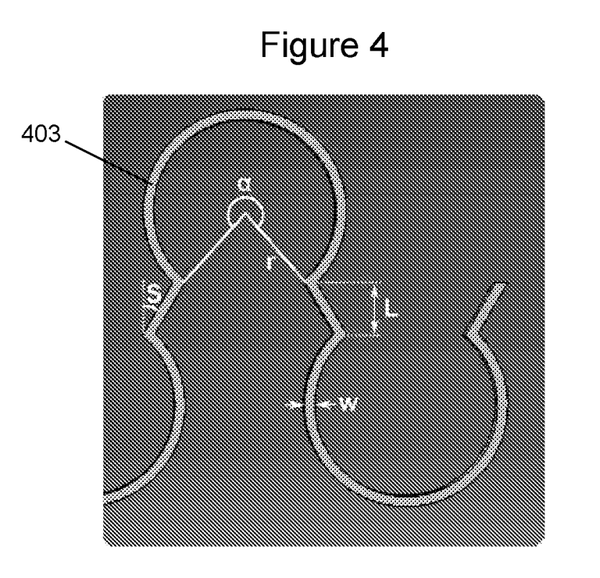
FIG. 4 illustrates schematically various dimensions of the electrical interconnect.

FIG. 4 illustrates schematically various dimensions of the electrical interconnect 403. These dimensions include the arc angle ($\alpha$), radius (r), track width (w), straight section angle (S), straight section length (L) and track thickness. The angle of the straight sections is measured relative to the normal of the support beam and may be varied independently of the other dimensions of the electrical interconnect 403. As will be described later, this provides control over the strain distribution and magnitude at the interconnect-beam interface.

Some of the physical dimensions can be scaled without affecting the stress/strain distribution at the interconnect-beam interface. For example, although varying the arc angle ($\alpha$) has been found to affect the stress in the electrical interconnect 403 (described later), the other track dimensions can be scaled (maintaining the relative dimensions) without affecting the stress. This means that the size and shape of the electrical interconnect 403 may be varied substantially whilst still benefiting from the technical advantages described herein. In general, the arc angle ($\alpha$) may range from 180° to 320°, the radius (r) may range from 1 μm to 1 cm, and the straight section angle (S) may range from −10° and +40°. Although it may be possible to produce electrical interconnects 403 with radii (r) outside of the above-mentioned range, this is unlikely to result in a useful apparatus/device. Furthermore, arc angles ($\alpha$) of less than 180° can result in large stresses and a reduced apparatus/device lifetime, whilst arc angles ($\alpha$) of greater than 320° can cause adjacent regions of the electrical interconnect 403 to intersect one another. Also, straight section angles (S) of below −10° can cause self-intersecting of the electrical interconnect 403, whilst straight section angles (S) of above +40° can cause the straight sections to align with the longitudinal stress/strain direction and can result in a decrease in the density of curved sections (with a corresponding increase in the stress of the electrical interconnect 403).

Figure 5A:
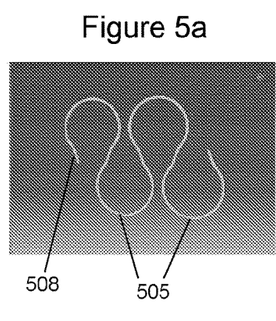
FIG. 5a illustrates schematically an electrical interconnect comprising straight sections oriented at a negative angle with respect to the normal of the support beam.
Figure 5B:
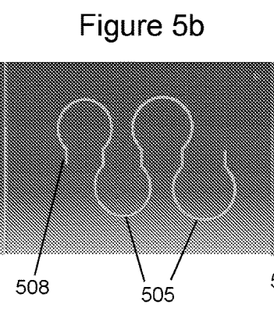
FIG. 5b illustrates schematically an electrical interconnect comprising straight sections oriented perpendicular to the length of the support beam.
Figure 5C:
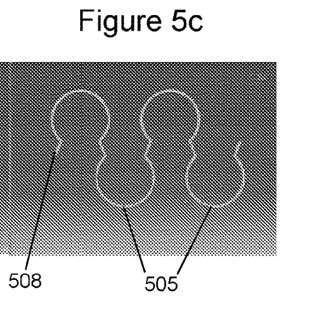
FIG. 5c illustrates schematically an electrical interconnect comprising straight sections oriented at a positive angle with respect to the normal of the support beam.

FIGS. 5a-5c illustrate electrical interconnects comprising straight sections 508 oriented at different angles. Throughout this specification, straight sections 508 which are reversed relative to the orientation of the serpentine configuration of FIGS. 1 and 2 are denoted with positive angles (FIG. 5c), straight sections 508 which are perpendicular to the length of the support beam are denoted with an angle of zero (FIG. 5b), and straight sections 508 which substantially follow the serpentine configuration of FIGS. 1 and 2 are denoted with negative angles (FIG. 5a). To put this another way, increasingly positive straight section angles move adjacent curved sections 505 on the same side of the support beam further apart (FIG. 5c vs FIG. 5b), and increasingly negative straight section angles move adjacent curved sections 505 on the same side of the support beam closer together (FIG. 5a vs FIG. 5b).

Figure 6:
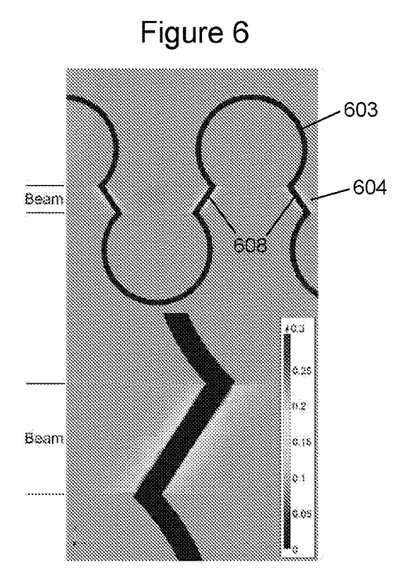
FIG. 6 illustrates schematically the strain profile of the support beam when a tensile stress is applied to the deformable substrate of FIG. 5c.

FIG. 6 shows a simulated strain profile (in plan view) for an apparatus in which the electrical interconnect 603 comprises straight sections 608 which are oriented at +30°. In this simulation, a tensile strain of 10% along the beam direction in the deformable substrate produced a peak strain of only 20% at the interconnect-beam interface—14 times lower than the strain produced using the original serpentine configuration. As well as a decrease in the peak strain magnitude, the use of straight sections 608 in the electrical interconnect also produced a more uniform strain distribution. This is clear when the magnified image of FIG. 2 is compared with the magnified image of FIG. 6. Being able to produce more uniform strain distributions of lower magnitude helps to reduce the chances of delamination and mechanical failure during operational strain of the apparatus. Furthermore, although not essential in all cases, the straight sections 608 of the electrical interconnect 603 should preferably have a length which is at least equal to the width of the support beam 604. This feature helps to prevent local strain peaks from occurring across the width of the support beam 604 and thus ensures a more uniform strain distribution.

In order to provide a more comprehensive analysis of the influence of straight section angle on peak strain, three sets of simulations were performed in which one or two dimension of the electrical interconnect were varied whilst the remaining parameters were kept constant. For each set of simulations, the straight section angle was varied from −10° to +40°, the straight section length was fixed at 100 μm, and the track width and thickness were both fixed at 20 μm.

In the first set of simulations, the radius of the curved sections was varied from 150 μm to 300 μm and the arc angle was fixed at 270°. In the second set of simulations, the arc angle was varied from 180° to 270° and the radius of the curved sections was fixed at 200 μm. In the third set of simulations, the radius of the curved sections was varied from 150 μm to 300 μm and the arc angle was varied from 237.5° to 303° to maintain a constant distance between adjacent straight sections and thus remove any effect of straight section density on the peak strain. In each simulation, the peak strain at the interconnect-beam interface was calculated for an applied tensile strain in the deformable substrate of 20% along the beam direction and subsequently plotted as a function of straight section angle.

Figure 7A:
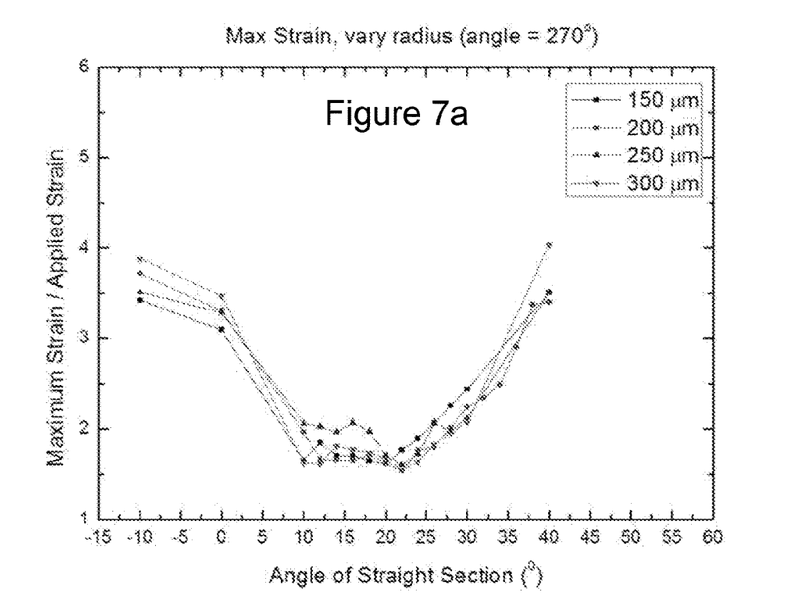
FIG. 7a illustrates graphically how the peak strain of the support beam varies with straight section angle for various radii of curved section.

FIG. 7a shows the results of the first set of simulations. Adding straight sections of any angle between −10° and +40° to the electrical interconnect was found to reduce the peak strain at the interconnect-beam interface when compared to the standard serpentine configuration. Furthermore, the use of straight sections oriented within the range of +10° to +25° was found to provide the lowest peak strain of less than twice the applied strain. Varying the radius alone had little impact on the peak strain at the interconnect-beam interface, however.

Figure 7B:
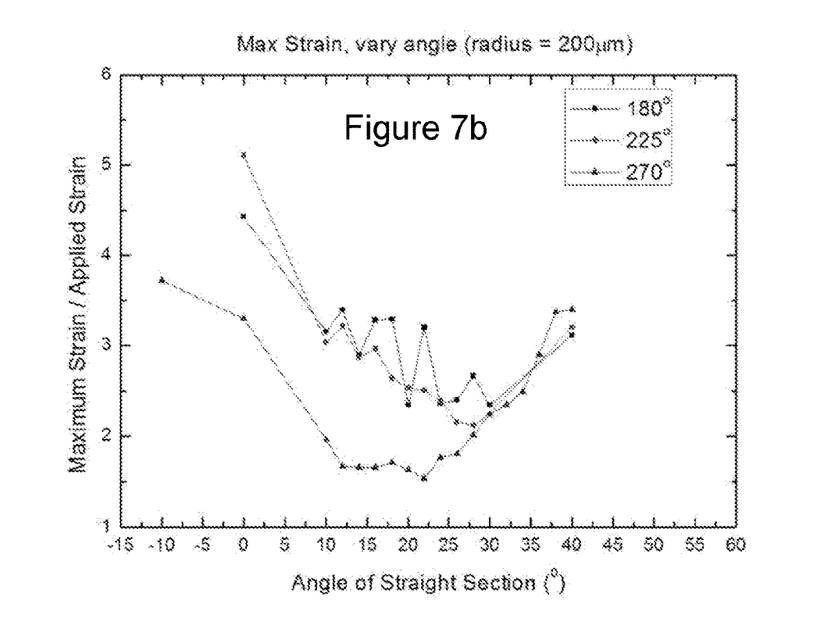
FIG. 7b illustrates graphically how the peak strain of the support beam varies with straight section angle for various arc angles of curved section.

FIG. 7b shows the results of the second set of simulations. In contrast to the change in radius, varying the arc angle did have an effect on the peak strain. Reducing the arc angle caused an increase in the peak strain and shifted the minimum peak strain to higher straight section angles (+25° to +30°). This simulation shows that the arc angle should be set as high as possible, and certainly greater than 180°, in order to reduce the strain at the interconnect-beam interface. In this respect, the shift to higher straight section angles should have little impact on the configuration of the electrical interconnect.

Figure 7C:
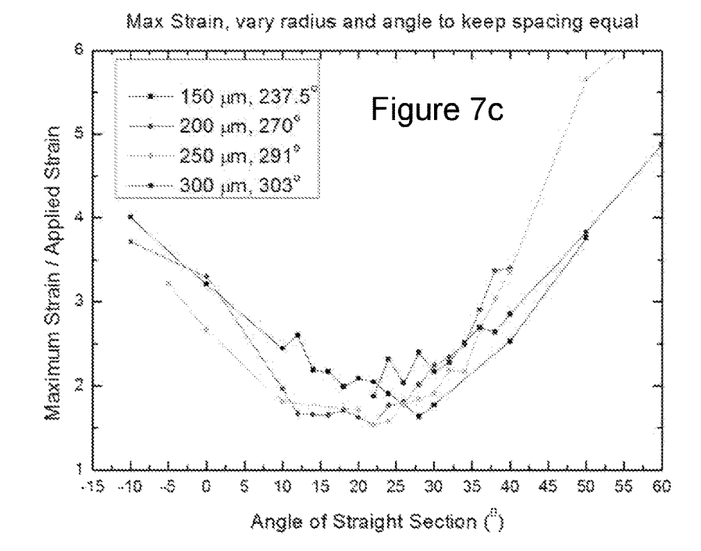
FIG. 7c illustrates graphically how the peak strain of the support beam varies with straight section angle for various radii and arc angles of curved section.

FIG. 7c shows the results of the third set of simulations. When both the radius and arc angle were varied simultaneously, there was little effect on the peak strain. Although there is a slight shift to higher straight section angles for the arc angle of 237.5°, this marks the beginning of the transition already observed in FIG. 7b.

Overall from these simulations, it is evident that there is a relatively broad range of straight section angles (for all geometries of electrical interconnect) over which the peak strain is substantially reduced relative to the standard serpentine configuration. In addition to using straight sections in the electrical interconnect, the strain may be further reduced by increasing the interfacial area between the electrical interconnect and the support beam.

Figure 8A:
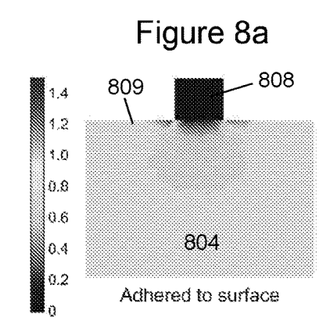
FIG. 8a illustrates schematically the strain profile of the support beam when the straight sections of the electrical interconnect are adhered to a surface of the support beam.
Figure 8B:
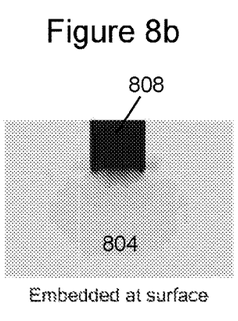
FIG. 8b illustrates schematically the strain profile of the support beam when the straight sections of the electrical interconnect are embedded within a volume of the support beam.
Figure 8C:
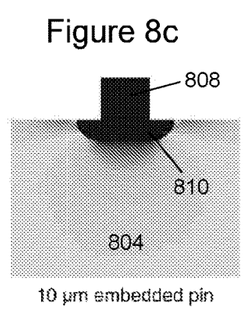
FIG. 8c illustrates schematically the strain profile of the support beam when protrusions of the straight sections are embedded within a volume of the support beam.

FIGS. 8a-8c show three different ways of attaching the electrical interconnect to the support beam. In FIG. 8a, the electrical interconnect is attached to the support beam 804 by adhesion of the straight sections 808 to a surface 809 of the support beam; and in FIG. 8b, the electrical interconnect is attached to the support beam 804 by embedding the straight sections 808 within a volume of the support beam 804. In FIG. 8c, the straight sections 808 of the electrical interconnect comprise respective protrusions 810 (in this example, 10 μm pins) extending therefrom, and the electrical interconnect is attached to the support beam 804 by embedding the respective protrusions 810 within a volume of the support beam 804. A fourth set of simulations were performed to determine the effect of each type of attachment on the peak strain at the interconnect-beam interface for varying angles of straight section.

Figure 9:
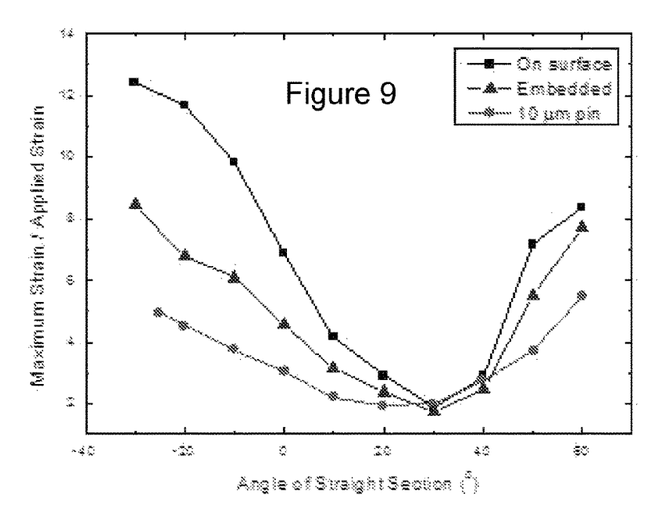
FIG. 9 illustrates graphically how the peak strain of the support beam varies with straight section angle for various interconnect-beam attachments.

FIG. 9 shows the results of the fourth set of simulations. As can be seen from this graph, embedding the straight sections within the support beam (FIG. 8b) had the effect of reducing the peak strain relative to the surface adhesion (FIG. 8a), and the introduction of embedded protrusions reduced the peak strain further still. It should be added that these simulations were carried out for copper interconnects. When polymer interconnects are used instead, the magnitudes of the strain at the interconnect-beam interface are somewhat lower but the same trends described herein are observed. The reason for the reduction in peak strain when the straight sections or protrusions are embedded in the support beam is because the strain induced at the interconnect-beam interface is distributed over a larger area, which in turn reduces the maximum strain value. This is evident from the cross-section strain profiles shown in FIGS. 8a-8c.

Figure 10:
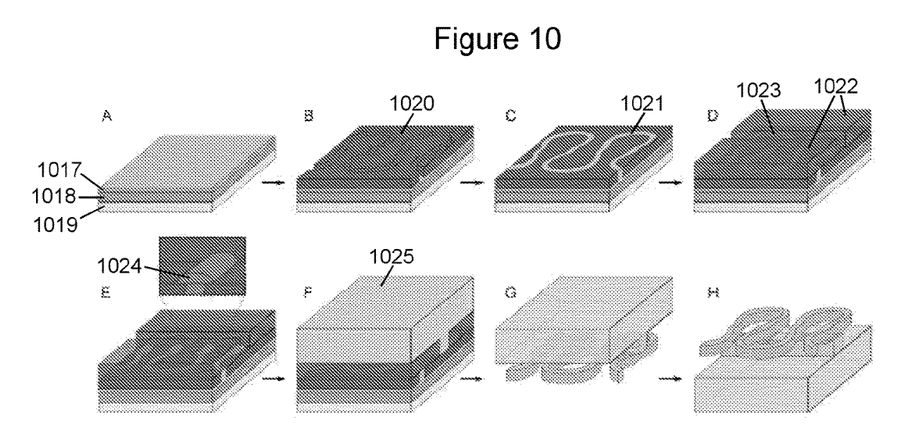
FIG. 10 illustrates schematically a method of forming the apparatus of FIG. 3.

FIG. 10 shows one method of fabricating an apparatus comprising an electrical interconnect having embedded protrusions. In this example, the electrical interconnect is formed from copper and the deformable substrate and support beam are formed from an elastomer. As described later, however, alternative materials could be used instead. The steps of the fabrication method are as follows: A: evaporate a Cu seed layer 1017 onto a photoresist release layer 1018 supported on a Si substrate 1019; B: spin coat and pattern a photoresist electrical interconnect mask 1020 on top of the Cu seed layer 1017; C: electroplate Cu 1021 through the photoresist 1020; D: spin coat a final photoresist layer 1022 and pattern a trench 1023 above the straight sections of the electrical interconnect (used to produce the support beam); E: electroplate Cu overfills 1024 within the trench 1023—inset shows form of overfill 1024 produced in the trench 1023 above each straight section; F: cast an elastomer 1025 onto the structure; G: remove the photoresist masks 1020, 1022 and release layer 1018; and H: invert the structure to give a supported electrical interconnect with overfill protrusions 1024.

Step E of FIG. 10 produces the protrusions 1024 due to the continuation of electrodeposition after the addition of the photoresist layer 1022 used to mask the trench region 1023. Continuing to electrodeposit in this confined region 1023 produces protrusions 1024 approximately semi-circular in cross-section parallel to the beam direction (a result of the growth mechanism during electrodeposition in the unmasked direction) whilst confined by the photoresist mask 1022 to the width of the straight section in the direction perpendicular to the beam (resulting in vertical end walls).

Figure 11A:
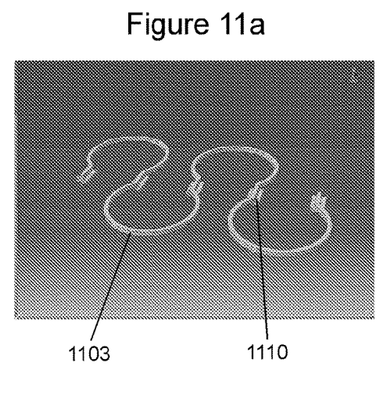
FIG. 11a illustrates schematically an electrical interconnect from above comprising straight sections having respective protrusions extending therefrom.
Figure 11B:
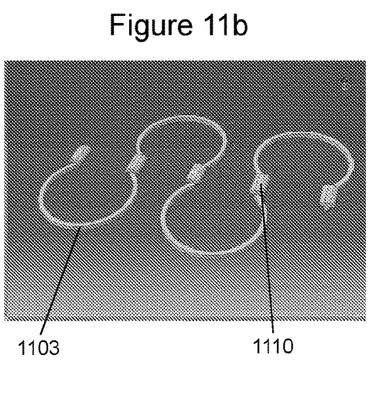
FIG. 11b illustrates schematically the electrical interconnect of FIG. 11a from below.

FIGS. 11a and 11b show the electrical interconnect 1103 (with protrusions 1110) formed using the process of FIG. 10 from above and below, respectively.

Figure 12:
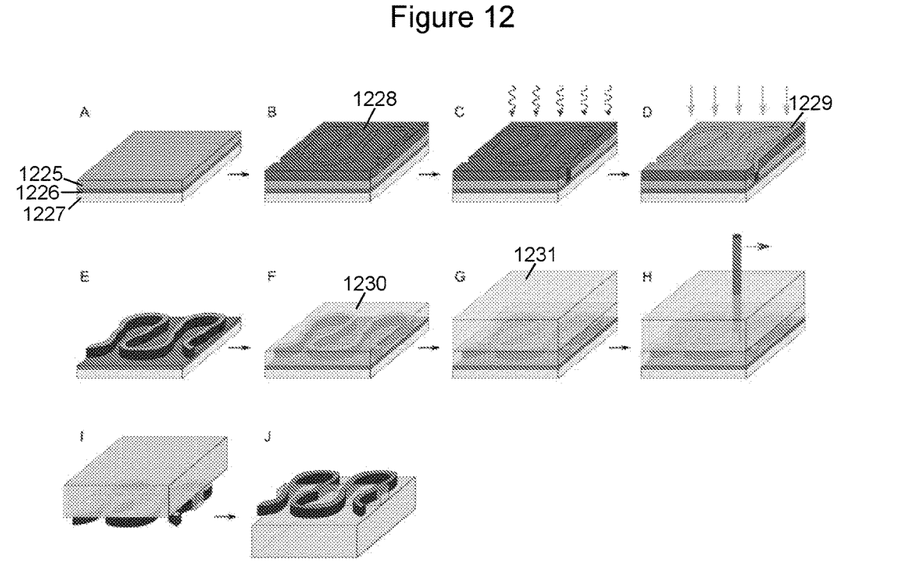
FIG. 12 illustrates schematically another method of forming the apparatus of FIG. 3.

FIG. 12 shows one method of fabricating an apparatus comprising an electrical interconnect having embedded straight sections. In this example, the electrical interconnect is formed from a thin metal layer on top of a supporting polymer, but other materials could be used instead. The steps of the fabrication method are as follows: A: spin-coat a layer of photo-patternable polymer 1225 onto a release layer 1226 supported on a Si substrate 1227; B: spin coat and pattern a photoresist electrical interconnect mask 1228 on top of the polymer layer 1225 (alternatively use a shadow mask); C: expose the polymer 1225 to UV through the mask 1228 and apply heat to induce cross-linking of the exposed regions; D: evaporate or sputter a thin metal layer 1229 onto the electrical interconnect through the mask 1228. E: remove the mask 1228 and un-crosslinked polymer 1225; F: bar-coat a thin layer of uncured photo-patternable elastomer 1230 over the electrical interconnect; G: laminate a layer of cured elastomer 1231 on top of the uncured photo-patternable elastomer 1230 to form the deformable substrate; H: use a UV laser to selectively crosslink the photo-patternable elastomer 1230 through the cured elastomer 1231 to form the support beam; I: remove the release layer 1226 and the un-crosslinked photo-patternable elastomer 1230; and J: invert the structure to give a supported electrical interconnect with embedded straight sections.

Figure 13:
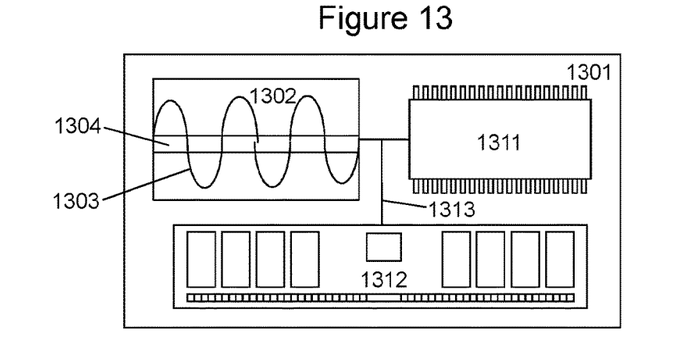
FIG. 13 illustrates schematically another apparatus comprising an electrical interconnect coupled to a deformable substrate via a support beam.

FIG. 13 shows one example of an apparatus 1301 comprising the deformable substrate 1302, electrical interconnect 1303 and support beam 1304 described herein. The apparatus 1302 also comprises a processor 1311 and a storage medium 1312, which are electrically connected to one another by a data bus 1313. The processor 1311 and storage medium 1312 may or may not form part of the deformable substrate 1302. The apparatus 1301 may be one or more of a portable electronic device, a portable telecommunications device, a mobile phone, a laptop computer, a tablet computer, a phablet computer, an electronic display, a sensor array, an adhesive bandage, a circuit board and a module for the same.

The deformable substrate 1302 may comprise one or more electronic components located thereon (not shown), and the electrical interconnect 1303 may be configured to provide an electrical interconnection between the one or more electronic components. Additionally or alternatively, the apparatus 1301 may comprise another substrate (not shown) comprising one or more electronic components located thereon. In this scenario, the electrical interconnect 1303 may be configured to provide an electrical interconnection between the one or more electronic components of the deformable substrate 1302 and the one or more electronic components of the other substrate.

The processor 1311 is configured for general operation of the apparatus 1301 by providing signalling to, and receiving signalling from, the other components to manage their operation. The storage medium 1312 is configured to store computer code configured to perform, control or enable operation of the apparatus 1301. The storage medium 1312 may also be configured to store settings for the other components. The processor 1311 may access the storage medium 1312 to retrieve the component settings in order to manage the operation of the other components. The processor 1311 may be a microprocessor, including an Application Specific Integrated Circuit (ASIC). The storage medium 1312 may be a temporary storage medium such as a volatile random access memory. On the other hand, the storage medium 1312 may be a permanent storage medium such as a hard disk drive, a flash memory, or a non-volatile random access memory.

Figure 14:
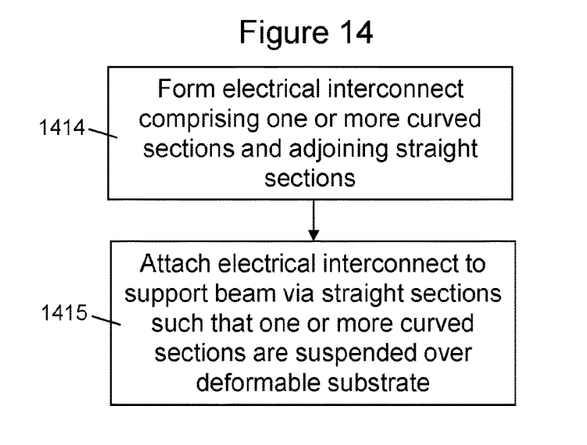
FIG. 14 shows the main steps of a method of making an apparatus described herein.

The main steps 1414-1415 of a method of making the apparatus described herein are shown schematically in FIG. 14. The method generally comprises: forming 1414 an electrical interconnect comprising one or more curved sections and adjoining straight sections; and attaching 1415 the electrical interconnect to a support beam via the straight sections such that the one or more curved sections are suspended over a deformable substrate. These steps 1414, 1415 may be performed separately or simultaneously using a variety of different fabrication processes.

One or both of the deformable substrate and support beam may be formed from at least one of a polymeric material, an elastomeric material, polyurethane, polyimide, polyethylene terephthalate, polydimethylsiloxane and polyethylene napthalate. In addition, the electrical interconnect may be formed from one or more of an electrically conductive material, an electrically conductive polymer, an electrically conductive elastomer, a metal, an alloy, copper, gold, silver, graphene, indium tin oxide and one or more carbon nanotubes.

Figure 15:
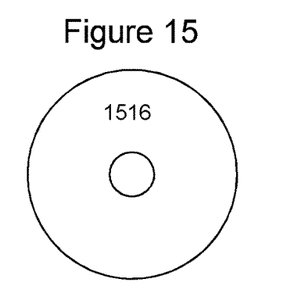
FIG. 15 shows a computer-readable medium comprising a computer program configured to perform, control or enable one or more of the method steps of FIG. 14.

FIG. 15 illustrates schematically a computer/processor readable medium 1516 providing a computer program according to one embodiment. The computer program may comprise computer code configured to perform, control or enable one or more of the method steps 1414-1415 of FIG. 14. In this example, the computer/processor readable medium 1516 is a disc such as a digital versatile disc (DVD) or a compact disc (CD). In other embodiments, the computer/processor readable medium 1516 may be any medium that has been programmed in such a way as to carry out an inventive function. The computer/processor readable medium 1516 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising a deformable substrate, an electrical interconnect suitable for interconnecting one or more electronic components located on the deformable substrate to one another or to one or more electronic components located on another substrate, and a support beam positioned between the electrical interconnect and the deformable substrate, wherein said support beam is configured to couple the electrical interconnect to the deformable substrate and maintain the electrical interconnect in a position which is spaced from the deformable substrate so that the electrical interconnect and the deformable substrate are separated from each other, wherein the electrical interconnect comprises one or more curved sections and adjoining straight sections, and wherein the electrical interconnect is attached to the support beam via at least one of the adjoining straight sections such that the one or more curved sections are suspended over the deformable substrate so as to be free to move relative to the deformable substrate to enable the electrical interconnect to accommodate strain when the deformable substrate undergoes operational deformation.

2. The apparatus of claim 1, wherein the electrical interconnect is configured such that the straight sections cross the support beam at an angle of between −10° and +40° with respect to the normal of the support beam.

3. The apparatus of claim 1, wherein the electrical interconnect is configured such that the curved sections have an arc angle of between 180° and 320° and a radius of between 1 μm and 1 cm.

4. The apparatus of claim 1, wherein the electrical interconnect is configured such that the straight sections cross the support beam at an angle of between +10° and +25° with respect to the normal of the support beam, and the curved sections have an arc angle of 270° and a radius of between 150 μm and 300 μm.

5. The apparatus of claim 1, wherein the electrical interconnect is configured such that the straight sections cross the support beam at an angle of between +25° and +30° with respect to the normal of the support beam, and the curved sections have an arc angle of between 180° and 270° and a radius of 200 μm.

6. The apparatus of claim 1, wherein the electrical interconnect is attached to the support beam by adhesion of the straight sections to a surface of the support beam.

7. The apparatus of claim 1, wherein the electrical interconnect is attached to the support beam by embedding of the straight sections within a volume of the support beam.

8. The apparatus of claim 1, wherein the straight sections of the electrical interconnect comprise respective protrusions extending therefrom, and wherein the electrical interconnect is attached to the support beam by embedding of the respective protrusions within a volume of the support beam.

9. The apparatus of claim 1, wherein the electrical interconnect and support beam are configured to lie parallel to, and spaced apart from, the planar surface of the deformable substrate.

10. The apparatus of claim 1, wherein the electrical interconnect has a serpentine configuration, and wherein the electrical interconnect is attached to the support beam such that adjacent curved sections of the serpentine configuration are positioned on opposite sides of the support beam.

11. The apparatus of claim 1, wherein the support beam is attached to, or forms part of, the deformable substrate.

12. The apparatus of claim 1, wherein the electrical interconnect is configured such that the straight sections have a length which is at least equal to the width of the support beam.

13. The apparatus of claim 1, wherein one or both of the deformable substrate and support beam are reversibly deformable.

14. The apparatus of claim 1, wherein one or both of the deformable substrate and support beam are at least one of reversibly flexible, reversibly stretchable and reversibly compressible.

15. The apparatus of claim 1, wherein one or both of the deformable substrate and support beam comprises at least one of a polymeric material, an elastomeric material, polyurethane, polyimide, polyethylene terephthalate, polydimethylsiloxane and polyethylene napthalate.

16. The apparatus of claim 1, wherein the electrical interconnect comprises one or more of an electrically conductive material, an electrically conductive polymer, an electrically conductive elastomer, a metal, an alloy, copper, gold, silver, graphene, indium tin oxide and one or more carbon nanotubes.

17. The apparatus of claim 1, wherein the deformable substrate comprises the one or more electronic components located thereon, and the electrical interconnect is configured to provide an electrical interconnection between the one or more electronic components.

18. The apparatus of claim 1, wherein the deformable substrate and the other substrate each comprise one or more of the electronic components located thereon, and the electrical interconnect is configured to provide an electrical interconnection between the one or more electronic components of the deformable substrate and the one or more electronic components of the other substrate.

19. An apparatus comprising a deformable substrate, an electrical interconnect suitable for interconnecting one or more electronic components located on the deformable substrate to one another or to one or more electronic components located on another substrate, and a support beam positioned between the electrical interconnect and the deformable substrate, wherein said support beam is configured to couple the electrical interconnect to the deformable substrate and maintain the electrical interconnect in a position which is spaced from the deformable substrate so that the electrical interconnect and the deformable substrate are separated from each other, wherein said support beam at least partially overlies said deformable substrate, wherein the electrical interconnect comprises one or more curved sections and adjoining straight sections, and wherein the electrical interconnect is attached to the support beam via at least one of the adjoining straight sections such that the one or more curved sections are suspended over the deformable substrate to enable the electrical interconnect to accommodate strain when the deformable substrate undergoes operational deformation.

20. An apparatus comprising a deformable substrate, an electrical interconnect suitable for interconnecting one or more electronic components located on the deformable substrate to one another or to one or more electronic components located on another substrate, and a support beam positioned between the electrical interconnect and the deformable substrate, wherein said support beam is configured to couple the electrical interconnect to the deformable substrate and maintain the electrical interconnect in a position which is spaced from the deformable substrate so that the electrical interconnect and the deformable substrate are separated from each other, wherein the electrical interconnect comprises one or more curved sections and adjoining straight sections, and wherein the electrical interconnect is attached to the support beam via at least one of the adjoining straight sections such that the one or more curved sections are suspended over the deformable substrate and off to at least one side of the support beam to enable the electrical interconnect to accommodate strain when the deformable substrate undergoes operational deformation.

* * * * *